United States Patent [19]

Goto

[11] Patent Number: 4,675,985

[45] Date of Patent: Jun. 30, 1987

[54] METHOD FOR MANUFACTURING A SEMICONDUCTOR MEMORY DEVICE HAVING A HIGH RADIATION RESISTANCE

[75] Inventor: Junichi Goto, Yokohama, Japan

[73] Assignee: Fujitsu Limited, Kawasaki, Japan

[21] Appl. No.: 568,034

[22] Filed: Jan. 4, 1984

[30] Foreign Application Priority Data

Jan. 12, 1983 [JP] Japan ................................ 58-3167

[51] Int. Cl.[4] .................. H01L 23/28; H01L 23/30
[52] U.S. Cl. ............................... 29/588; 357/72; 174/52 PE; 156/331.1
[58] Field of Search ....................... 29/588; 357/72; 174/52 PE; 156/333.1

[56] References Cited

U.S. PATENT DOCUMENTS 4,284,461  8/1981  St. Clair et al. .................. 156/331.5

Primary Examiner—Brian E. Hearn
Assistant Examiner—John T. Callahan
Attorney, Agent, or Firm—Staas & Halsey

[57] ABSTRACT

In a method for manufacturing a semiconductor memory device, a semiconductor chip and an adhesive tape having an adhesive layer are prepared. The adhesive layer comprises a polyamic acid intermediate derived for example from a pyromellitic dianhydride and a diamine. The adhesive tape is pressed onto the semiconductor chip at a temperature of from about 250° C. to about 400° C. for a predetermined time period such as 2 to 5 sec.

26 Claims, 9 Drawing Figures

METHOD FOR MANUFACTURING A SEMICONDUCTOR MEMORY DEVICE HAVING A HIGH RADIATION RESISTANCE

BACKGROUND OF THE INVENTION

The present invention relates to a method for manufacturing a semiconductor memory device having a high resistance to radiation such as α-rays.

Recently, metal-oxide semiconductor (MOS) memory cells such as one-transistor one-capacitor type memory cells have been developed so as to reduce the size of the elements of each memory cell, thereby obtaining a large capacity, highly integrated semiconductor memory device. However, this size reduction of the memory cells increases the generation rate of soft errors due to α-rays.

In order to reduce the generation of soft errors, various kinds of technology have been introduced. For example, technology for improving the configuration of capacitors of the memory cells has been introduced into a design step so as to effectively increase the capacitance of the capacitors. In addition, an intrinsic gettering technology has been introduced into a manufacturing step, and formation of a mechanical structure for shielding the memory cells from α-rays has been introduced into an assembly step.

The present invention is directed to the improvement of such a mechanical shield structure formed during the assembly step.

A first prior art method for forming an α-ray shield structure has been performed by a potting technology using liquid polyimide, thereby forming a polyimide layer for shielding a semiconductor chip from α-rays. In this first prior art method, however, the center portion of the polyimide layer is relatively thick so as to completely shield the chip from α-rays, while the peripheral portions of the polyimide layer are relatively thin giving an insufficient shielding. (see: GB-A-2036428)

A second prior art method is performed by using a polyimide tape having a high resistance to α-rays. That is, this polyimide tape is adhered by an adhesive to a semiconductor chip. In this case, the adhesive comprises a polyamic acid intermediate of the general formula:

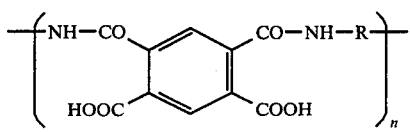

which is derived from for example pyromellitic dianhydride, as in the formula below,

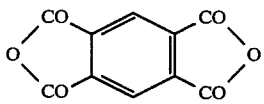

and diamine, as in the following formula $$H_2N-R-NH_2$$

That is, the following cyclic condensation polymerization is performed upon the pyromellitic dianhydride and the diamine so as to form heat-resistant polyimide:

First stage reaction

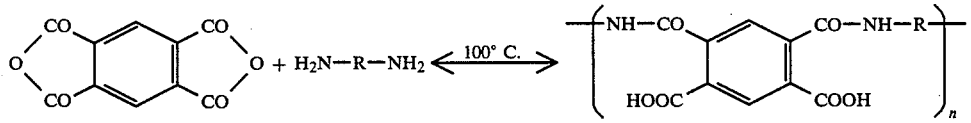

Second stage reaction

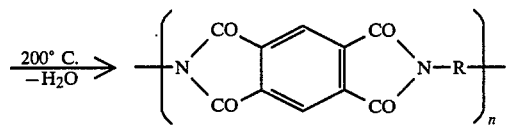

The first stage stage reaction is reversible, while the second stage reaction is irreversible.

However, in the second prior art method, the adhering of the polyimide tape is carried out at a relatively low temperature, from about 150° C. to 250° C., for a relatively long time period of about 10 sec to 30 sec, and accordingly, the adhesive develops enormous macromolecules, so that the heat shrinkage distortion of the hardened adhesive becomes large. As a result, the passivation films, the connection layers, and the like may be peeled off, thereby reducing the manufacturing efficiency and yields.

SUMMARY OF THE INVENTION

It is an object of the present invention to provide a method for adhering a radiation-resistant tape onto a semiconductor chip without generating a large heat shrinkage distortion on the surface of the semiconductor chip, thereby improving the manufacturing efficiency and yields.

According to the present invention, the adhesive tape is pressed onto the semiconductor chip while undergoing heating at a relatively high temperature of from about 250° C. to about 400° C. for a predetermined time the period. As a result, the polyamic acid intermediate is decomposed, so that the residue of the pyromellitic dianhydride and the diamine as shown in the first stage reaction becomes large in the hardened adhesive, and the mean molecular weight of the hardened adhesive becomes small. Therefore, the heat shrinkage distortion on the surface of the semiconductor chip is reduced.

BRIEF DESCRIPTION OF THE DRAWINGS

The present invention will be more clearly understood from the decription as set forth below with reference to the accompanying drawings.

DESCRIPTION OF THE PREFERRED EMBODIMENT

Figure 1:
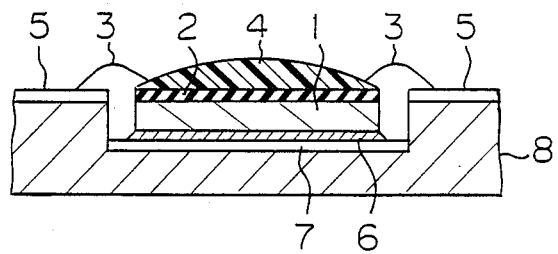
FIG. 1 is a cross-sectional view of a semiconductor memory device manufactured by the first prior art method.

In FIG. 1, which illustrates a first prior art arrangement, reference numeral 1 designates a semiconductor chip, 2 a passivation layer such as phosphosilicate glass (PSG), silicon dioxide ($SiO_2$), and the like, 3 a bonding wire, 4 a polyimide layer having a high resistance to $\alpha$-rays, 5 a lead, 6 solder, 7 a chip stage, and 8 a ceramic package.

As explained above, the polyimide layer 4 in FIG. 1 is formed by the potting method. Therefore, although the polyimide layer 4 can be more than 100 $\mu$m thick at the center portion of the semiconductor chip 1, the polyimide layer 4 is only 50 $\mu$m at the peripheral portions of the semiconductor chip 1. Note that the polyimide layer 4 is required to be at least 75 $\mu$m thick, in order to obtain a complete shielding effect from $\alpha$-rays. Therefore, the effect of preventing $\alpha$-ray problems is not sufficient for the memory cells arranged in the proximity of the peripheral portions of the chip 1.

Figure 2:
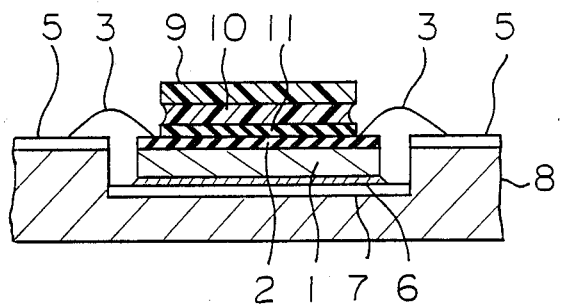
FIG. 2 is a cross-sectional view of a semiconductor memory device manufactured by the second prior art method.

In FIG. 2, which illustrates the second prior art method, a polyimide tape 9 having an adhesive layer 10, and an absorption polyimide layer 11 for absorbing stresses are provided instead of the polyimide layer 4 in FIG. 1. In this case, the thickness of the polyimide tape 9 is such, for example, 75 $\mu$m as to exhibit a sufficient shielding effect from $\alpha$-rays.

The adhering of the polyimide tape 9 in FIG. 2 to the semiconductor device is performed during a wafer process step and an assembly step. That is, a completed wafer is spun and coated with a polyamic acid intermediate, and is then cured at a temperature of from about 250° C. to about 300° C., so as to form a thin polyimide film having a thickness of about 20 $\mu$m to about 30 $\mu$m. Patterning is then performed upon the wafer, so as to form one absorption polyimide layer 11 for each semiconductor chip. Then the wafer is scribed and cut into a plurality of semiconductor chips.

Each semiconductor chip 1 having the polyimide layer 11 on the upper portion thereof is mounted on the package 8, and a wire 3 is cross-linked between the chip 1 and the lead 5. Then, the polyimide tape 9 having the adhesive layer 10 is adhered to the semiconductor chip 1 at a relatively low temperature of from about 150° C. to about 250° C. Note that the polyimide tape 9 with the adhesive layer 10 is shaped in advance with a desired dimension. Thus, after curing at a predetermined temperature, so as to completely harden the adhesive layer 10, the semiconductor memory device as shown in FIG. 2 is completed.

In the semiconductor memory device as shown in FIG. 2, the adhering of the polyimide tape to the semiconductor chip is carried out at a relatively low temperature, in order to avoid the rapid generation of evaporated components from the adhesive layer 10, wherein the adhesives of the adhesive layer 10 develop enormous macro-molecules having a molecular weight in the millions, so that the heat shrinkage distortion of the hardened adhesives becomes large. Such macro-molecules can be observed by a microscope. As a result, a large stress is imposed over the surface of the passivation layer 2, including any connection films, and on the surface of the chip 1, and, accordingly, the above-mentioned absorption polyimide layer cannot exhibit a sufficient shielding effect. Therefore, the passivation layer 2 or the like may be easily peeled off, thereby reducing the manufacturing efficiency and yield.

The method for manufacturing a semiconductor memory device according to the present invention will now be explained with reference to FIGS. 3A through 3D.

Figure 3A:
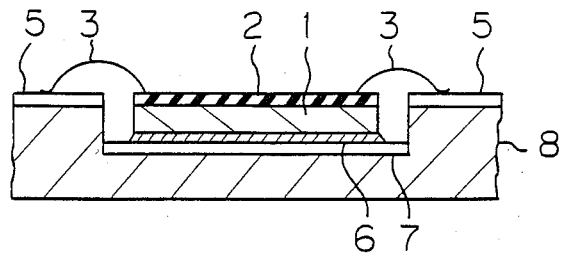
FIGS. 3A through 3D are cross-sectional views of a semiconductor memory device manufactured by the method according to the present invention.

As illustrated in FIG. 3A, a semiconductor chip 1 including memory cells, and particularly random access memory (RAM) cells, is mounted on a ceramic package 8, and a wire 3 is cross-linked between the chip 1 and the lead 5 of the package 8 in the conventional way. Note that the elements in FIG. 3A are the same as those shown in FIGS. 1 and 2.

Figure 3B:
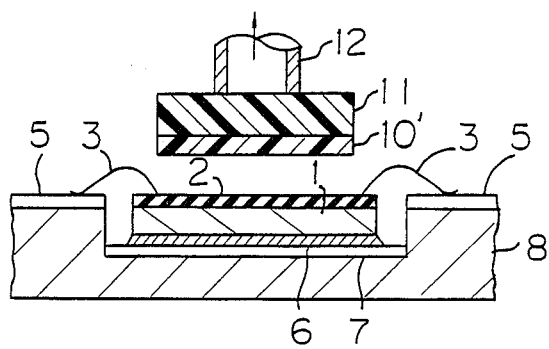

Next, an adhesive tape 9 having an adhesive layer 10' as shown in FIG. 3B is prepared. This layer 9 is made of polyimide having a thickness of from about 75 $\mu$m to about 125 $\mu$m, in order to avoid soft errors due to $\alpha$-rays.

The above-mentioned polyimide tape 9 having the adhesive layer 10' is obtained by coating on one surface thereof a polyamic acid intermediate of the general formula:

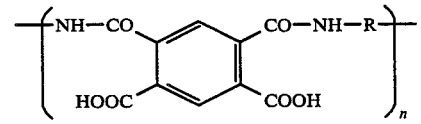

which is derived from for example pyromellitic dianhydride, as in the formula below

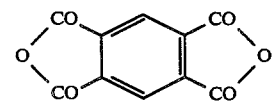

and diamine as in the following formula,

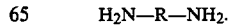

The polyamic acid intermediate can be modified such as with an organic silicone or aluminum chelate to form a modified polyimide. The adhesive layer 10' has a thickness of about 10 to about 30 μm, and the polyimide tape 9 with the adhesive layer 10' is shaped by a cutting method so as to cover at least the cell portion of the chip 1.

With respect to FIG. 3B, the polyimide tape 9 having the adhesive layer 10' on the back surface thereof is sucked by air tweezers 12 and is then moved onto the chip 1 mounted on the package 8, which is heated to a relatively high temperature of from about 250° C. to about 400° C.

Figure 3C:
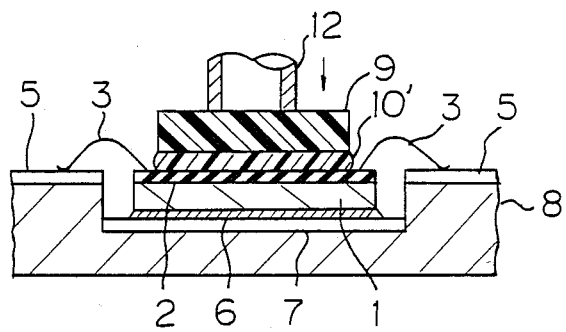

Then, as shown in FIG. 3C, the polyimide tape 9 is pressed onto the chip 1 at a pressure of about 50 to 200 g (corresponding to about 200 to 1000 g/cm$^2$) for a time period shorter than 10 sec, for example, for about 2 to 5 sec.

Figure 4:
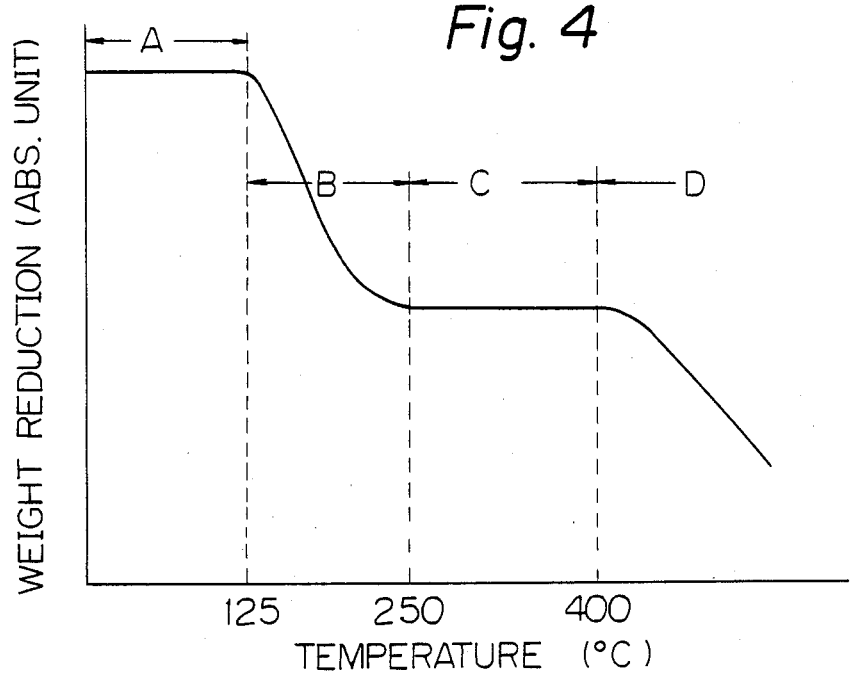
FIG. 4 is a graph showing the characteristics of the weight reduction by the above-mentioned cyclic condenstion polymerization reaction.

The polyimide tape 9 is adhered at the above-mentioned pressure to the chip 1. However, although the adhesives of the adhesive layer 10' develop macromolecules having a molecular weight of hundreds of thousands, the mean molecular weight of the macromolecules does not reach such a weight. That is, as shown in FIG. 4, when the temperature is more than 250° C., the above-mentioned second stage reaction rapidly progresses, due to the dehydration, so that the mean molecular weight of the adhesive layer 10' is reduced. However, since the residue of the pyromellitic dianhydride and the diamine in the first stage reaction is large, due to the rapid increase of the temperature of the adhesive layer 10', the mean molecular weight is relatively small. As a result, the adhesive layer 10' becomes porous, so that the heat shrinkage distortion of the adhesive layer 10' becomes small.

Figure 5:
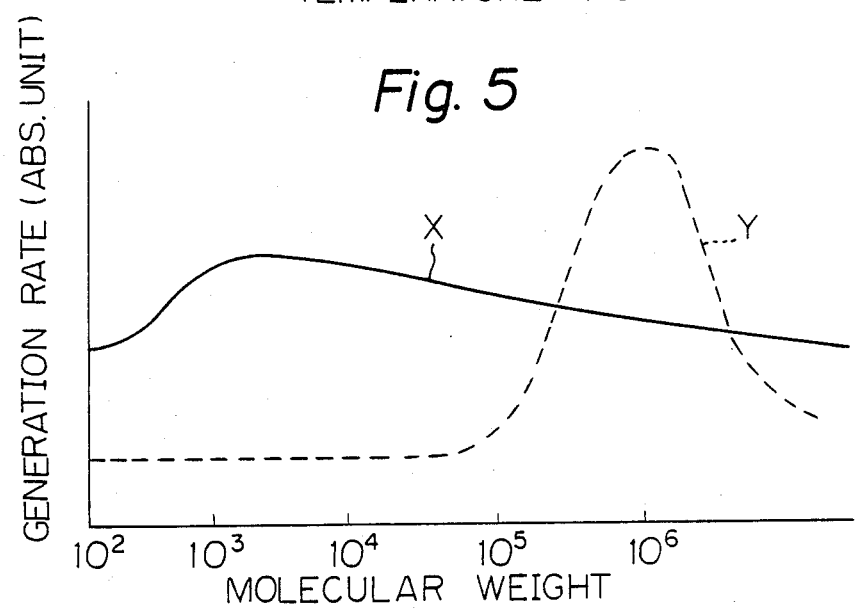
FIG. 5 is a graph showing the molecular weight distribution characteristics by the above-mentioned cyclic condensation polymerization reaction.

In FIG. 4, A designates a region of the first stage reaction, B designates a region of the second stage reaction, C designates a region wherein the second stage reaction is complete, and D designates a region of the thermal decomposition of the polyimide. However, FIG. 4 illustrates the characteristics of the weight reduction when the temperature "gradually" increases. Therefore, according to the present invention, since the temperature "rapidly" increases to more than 250° C., but less than 400° C., the residue of the pyromellitic dianhydride and the diamine in the first stage reaction increases. As a result, the molecular weight characteristics of the adhesive layer 10' are indicated by the line X as shown in FIG. 5. The half-maximum width is seen to be greater than two orders of magnitude. The line Y as shown in FIG. 5 indicates the molecular weight characteristics of the adhesive layer 10 of the prior art semiconductor device in FIG. 2. The half-maximum width is seen to be approximately one order of magnitude.

Preferably, the upper temperature of the package 8, i.e., the chip 1, during the adhering step is about 350° C., in order to avoid harmful effects to the elements of the chip 1.

Returning to FIG. 3D, the completed state of the semiconductor memory device is illustrated. In this state, this device is further heated at a temperature of about 250° C. for about one hour, to cure the adhesive layer 10'. As a result, the adhesive layer 10' is securely adhered to the chip 1, since the macro-molecules of the adhesive layer 10' have not increased during such curing and, in addition, such curing is performed in order to remove the aqueous component and the gas component from the adhesive layer 10'.

Hereinafter, the semiconductor memory device is completed by sealing it with a ceramic cap, which is not shown.

Figure 6:
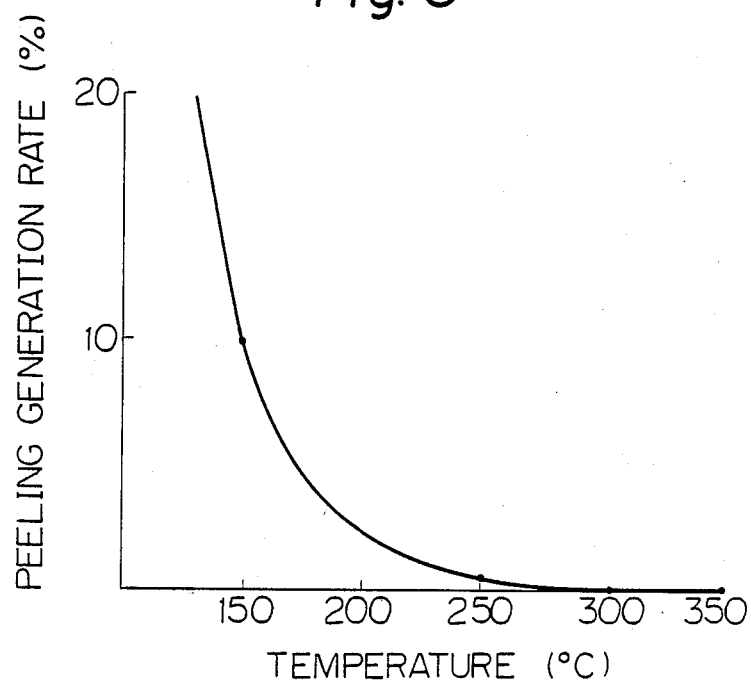
FIG. 6 is a graph showing the characteristics of the peeling generation rate with respect to the temperature, to explain the effects of the present invention.

As illustrated in FIG. 6, which shows the relationship between the temperature for the heating and pressing of the semiconductor chip 1 during the step as shown in FIG. 3C, and the generation rate of peeling off from an insulating layer such as the passivation layer 2, obviously, the generation rate of peeling in the insulating layer is lower than 1% within the heat and pressing temperature of from about 250° C. to about 300° C.

The above-mentioned generation rate of peeling is obtained by an electric characteristic test and a peeling test for the polyimide tape 9 due to hydrazine boiling.

In addition, the polyimide tape 9 at a heat and pressing temperature prescribed by the present invention is completely adhered to a predetermined position in a time period shorter than 10 sec.

Benzophenonetetracarboxylic dianhydride can be used instead of pyromellitic dianhydride.

As explained above, according to the present invention, when a polyimide tape is adhered to a semiconductor chip, the peeling of an insulating layer on the surface of the semiconductor chip and the peeling of the semiconductor chip due to the heat shrinkage distortion can be avoided. Therefore, α-rays incident to the memory cells of the chip can be completely shielded by the polyimide tape, thereby improving the manufacturing and efficiency yields of a semiconductor device such as an MOS memory device.

I claim:

1. A method for manufacturing a semiconductor memory device having a high resistance to radiation, comprising the steps of:
   preparing a semiconductor chip with a passivation layer of phosphosilicate glass or silicon dioxide;
   preparing an adhesive tape comprising a radiation-resistant layer and an adhesive layer on a surface of said radiation resistant layer, said adhesive layer comprising a polyamic acid intermediate;
   directly pressing said adhesive layer of said adhesive tape onto said passivation layer of said semiconductor chip while the chip is heated at a temperature in the range from about 250° C. to about 400° C. for a predetermined time period.

2. A method as set forth in claim 1, wherein said polyamic acid intermediate is modified with an organic silicone or aluminum chelate.

3. A method as set forth in claim 1, wherein said dianhydride is pyromellitic dianhydride.

4. A method as set forth in claim 1, wherein said dianhydride is benzophenonetetracarboxylic dianhydride.

5. A method as set forth in claim 1, wherein said predetermined time period is in the range from about 2 sec to about 10 sec.

6. A method as set forth in claim 5, wherein said range of said predetermined time period is up to about 5 sec.

7. A method as set forth in claim 1, further comprising the step of curing said semiconductor memory device at a temperature of about 250° C. for a further predetermined time period, after the pressing step.

8. A method as set forth in claim 7, wherein said further predetermined time period is about 1 hour.

9. A method as set forth in claim 1, wherein said range of temperature extends up to about 350° C.

10. A method as set forth in claim 1, wherein said radiation-resistant layer comprises a polyimide having a thickness in the range from about 75 μm to about $12^{-5}$ μm.

11. A method as set forth in claim 1, wherein the thickness of said adhesive layer is in the range from about 10 to about 30 μm.

12. The method of claim 1, wherein said adhesive layer is provided with a peak value in the distribution of its molecular weight that is less than $10^5$.

13. The method of claim 12, said peak value being less than $10^4$.

14. The method of claim 12, wherein said distribution of molecular weight is provided with a half-maximum width of more than approximately one order of magnitude on a decimal scale.

15. The method of claim 14, wherein said half-maximum width is provided with about 2 or more of said orders of magnitude.

16. The method of claim 1, said polyamic acid intermediate being of the general formula

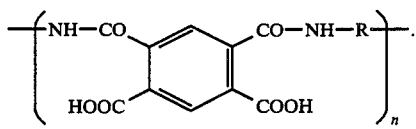

17. The method of claim 16, said dianhydride being pyromellitic dianhydride.

18. The method of claim 1, said polyamic acid intermediate being of the general formula

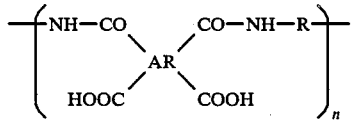

wherein AR is an aromatic hydrocarbon group.

19. The method of claim 18, said AR being a phenyl group.

20. The method of claim 19, said dianhydride being benzophenonetetracarboxylic dianhydride which has the formula

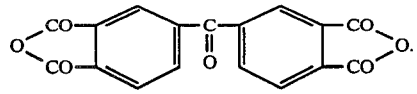

21. The method of claim 20, said phenyl group being

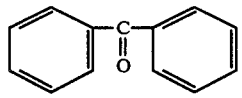

22. The method of claim 19, said phenyl group being

23. The method of claim 22, said dianhydride being pyromellitic dianhydride.

24. The method of claim 1, said range being from above about 250° C.

25. The method of claim 1, comprising a passivation layer on said chip, said passivation layer excluding polyimide.

26. The method of claim 1, wherein said pressing of said adhesive layer of said adhesive tape onto said chip occurs at a pressure in the range from 200 to 1000 g/cm².

* * * * *

UNITED STATES PATENT AND TRADEMARK OFFICE
CERTIFICATE OF CORRECTION

PATENT NO. : 4,675,985

DATED : June 30, 1987

INVENTOR(S) : Goto

It is certified that error appears in the above-identified patent and that said Letters Patent is hereby corrected as shown below:

Fig. 3B, "11" should be --9--.

Figure 3D:
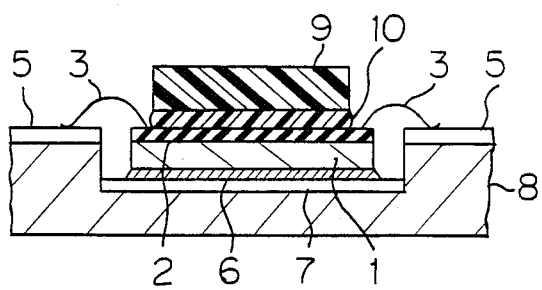

Fig. 3D, "10" should be --10'--.

Signed and Sealed this

Twenty-sixth Day of April, 1988

Attest:

DONALD J. QUIGG

*Attesting Officer*         *Commissioner of Patents and Trademarks*